US010840575B2

(12) United States Patent
Lee et al.

(10) Patent No.: US 10,840,575 B2
(45) Date of Patent: Nov. 17, 2020

(54) BAND PASS FILTER INCLUDING MICROSTRIP TRANSMISSION LINE

(71) Applicant: LIK-TECH CO., LTD., Gyeonggi-do (KR)

(72) Inventors: Sang Yeol Lee, Gyeonggi-do (KR); Jae Pil Kim, Gyeonggi-do (KR); Young Kyun Lim, Gyeonggi-do (KR)

(73) Assignee: LIK-TECH CO., LTD., Gyeonggi-do (KR)

( * ) Notice: Subject to any disclaimer, the term of this patent is extended or adjusted under 35 U.S.C. 154(b) by 0 days.

(21) Appl. No.: 16/338,746

(22) PCT Filed: Jul. 26, 2017

(86) PCT No.: PCT/KR2017/008028
§ 371 (c)(1),
(2) Date: Apr. 2, 2019

(87) PCT Pub. No.: WO2018/066793
PCT Pub. Date: Apr. 12, 2018

(65) Prior Publication Data
US 2020/0144689 A1 May 7, 2020

(30) Foreign Application Priority Data
Oct. 5, 2016 (KR) .................. 10-2016-0128615

(51) Int. Cl.
*H01P 1/203* (2006.01)
*H01P 3/08* (2006.01)
*G01R 23/165* (2006.01)
*H01P 11/00* (2006.01)

(52) U.S. Cl.
CPC ........ *H01P 1/20327* (2013.01); *G01R 23/165* (2013.01); *H01P 1/203* (2013.01); *H01P 3/081* (2013.01); *H01P 11/001* (2013.01)

(58) Field of Classification Search
CPC ....... H01P 1/203; H01P 1/20327; H01P 3/081
USPC ................................................ 333/204, 205
See application file for complete search history.

(56) References Cited

U.S. PATENT DOCUMENTS

2011/0215886 A1* 9/2011 Kawai .................... H01P 1/203
333/219

FOREIGN PATENT DOCUMENTS

| KR | 1020010093794 | 10/2001 |
| KR | 100907270 | 7/2009 |
| KR | 1020100042308 | 4/2010 |
| KR | 1020100132237 | 12/2010 |
| KR | 1020110066605 | 6/2011 |

* cited by examiner

*Primary Examiner* — Rakesh B Patel
(74) *Attorney, Agent, or Firm* — IPLA P.A.; James E. Bame

(57) ABSTRACT

A band pass filter including a microstrip transmission line comprises: a substrate having a grounding surface formed on a rear surface thereof; an input port which is formed on an upper surface of the substrate and receives a transmission signal; an output port which is formed on the upper surface of the substrate and outputs a filtered transmission signal; and a plurality of signal transmission lines spaced at predetermined distance from one another in parallel, each of the plurality of signal transmission lines having one end connected to and in contact with the input port, and having the other end connected to and in contact with the output port.

8 Claims, 9 Drawing Sheets

FIG. 7
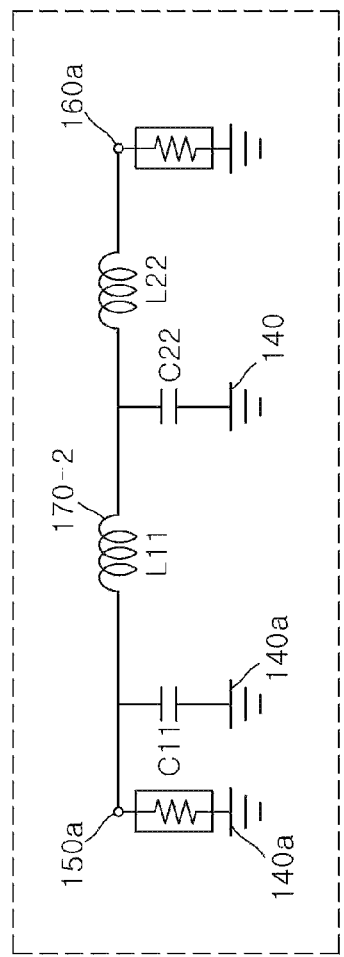
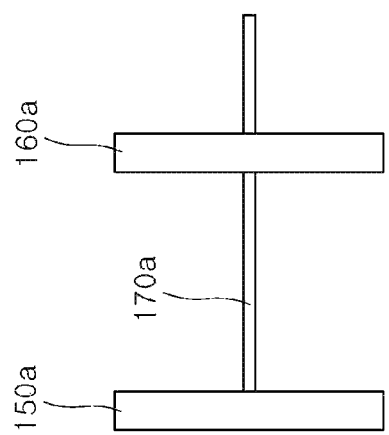

FIG. 10
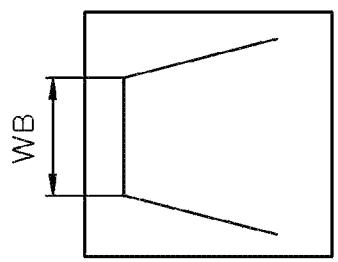
=
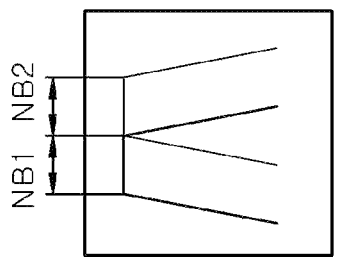
=
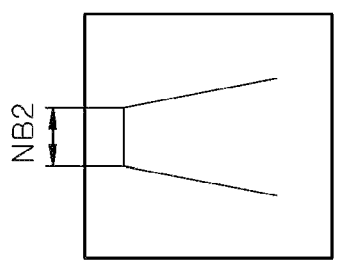
+
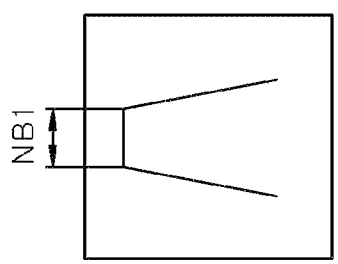

BAND PASS FILTER INCLUDING MICROSTRIP TRANSMISSION LINE

BACKGROUND

The present invention relates a band pass filter, and more specifically, to a band pass filter including a microstrip transmission line.

As demands on portable mobile products increase and wireless and mobile communications are developed recently, demands on components of high-frequency signals such as radio frequency (RF) and microwave frequency signals are increased. Among the high-frequency signal components, a band pass filter (BPF) is an important component for accurately filtering signals of a frequency band desired by a designer from various frequency bands and transmitting the filter signals. Particularly, as frequency bands to be used for high-frequency signal components used in various products have already been determined, accuracy and reliability of the band pass filter become an important issue.

An input port or an output port of a band pass filter is designed to have a fixed impedance value from the design stage and is adjusted to a desired impedance value through impedance matching. The method of impedance matching uses an impedance transformer, and the lower the frequency is, the size of the impedance transformer increases. Accordingly, there is a difficulty in reducing the size of the band pass filter, and there is also a limit in reducing the size of a mobile product applying the band pass filter.

SUMMARY OF THE INVENTION

Therefore, the present invention has been made in view of the above problem, and it is an object of the present invention to provide a band pass filter including a microstrip transmission line for implementing the band pass filter, which can pass transmission signals in a frequency band desired by a designer without an impedance transformer.

To accomplish the above object, according to one aspect of the present invention, there is provided a band pass filter including: a substrate having a ground plane formed on a rear surface; an input port formed on a top surface of the substrate to receive a transmission signal; an output port formed on the top surface of the substrate to output a filtered transmission signal; and a plurality of signal transmission lines disposed in parallel to be spaced apart from each other as much as a predetermined distance, each of which an end is connected in contact with the input port, and the other end is connected in contact with the output port.

According to another aspect of the present invention, there is provided a band pass filter including: a substrate having a ground plane formed on a rear surface; a microstrip transmission line including: an input port formed on a top surface of the substrate to receive a transmission signal, an output port formed on the top surface of the substrate to output a filtered transmission signal, and a plurality of signal transmission lines disposed in parallel to be spaced apart from each other as much as a predetermined distance, each of which an end is connected in contact with the input port, and the other end is connected in contact with the output port; and at least two microstrip transmission lines connected on the substrate in series.

According to still another aspect of the present invention, there is provided a band pass filter including: a substrate having a ground plane formed on a rear surface; a microstrip transmission line including: an input port formed on a top surface of the substrate to receive a transmission signal, an output port formed on the top surface of the substrate to output a filtered transmission signal, and a plurality of signal transmission lines disposed in parallel to be spaced apart from each other as much as a predetermined distance, each of which an end is connected in contact with the input port, and the other end is connected in contact with the output port; a first ground plane disposed to be spaced apart from one side surface of the microstrip transmission line as much as a first distance; and a second ground plane disposed to be spaced apart from the other side surface of the microstrip transmission line as much as a second distance.

According to the present invention, there is an advantage of miniaturizing a band pass filter as an impedance transformer for impedance matching can be omitted by disposing a plurality of signal transmission lines between an input port and an output port of a microstrip transmission line. Accordingly, there is an advantage of miniaturizing an electronic device adopting the band pass filter.

In addition, there is an advantage of adjusting a bandwidth without changing a central frequency by disposing a plurality of signal transmission lines between an input port and an output port and adjusting an input impedance value.

Furthermore, the central frequency can be changed to a frequency desired by a designer by adjusting the number of signal transmission lines disposed in the shape of a line connected between an input port and an output port.

BRIEF DESCRIPTION OF THE DRAWINGS

FIG. 7 is a view showing a structure and an equivalent circuit of a low pass filter.

FIG. 10 is a view illustrating the bandwidth of the band pass filter of FIG. 9.

DETAILED DESCRIPTION OF THE INVENTION

Although the embodiments of the present invention are described with reference to the drawings, this is to describe the present invention proposed in this application and is not intended to limit the present invention proposed in this application to a precisely presented configuration.

Throughout the specification, like reference symbols denote like components. Accordingly, the same or similar reference symbols may be explained with reference to other drawings although they are not mentioned or explained in corresponding drawings. In addition, although a reference symbol is not displayed, it may be explained with reference to other drawings.

Figure 1:
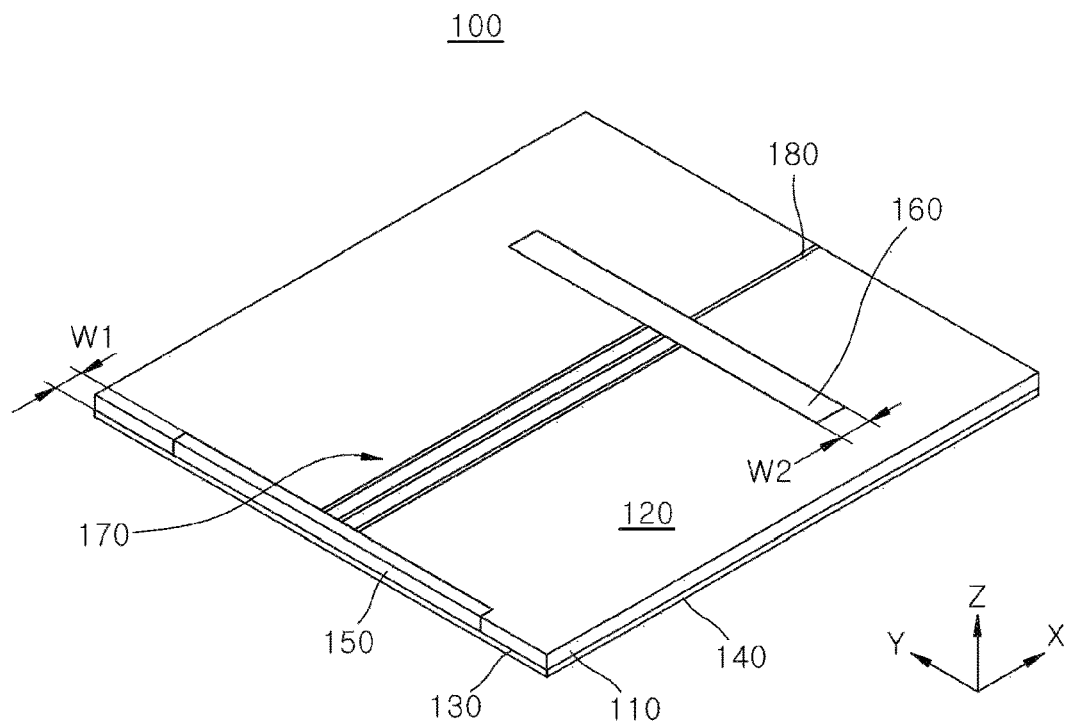
FIG. 1 is a perspective view showing a band pass filter including a microstrip transmission line according to an embodiment of the present invention.
Figure 2:
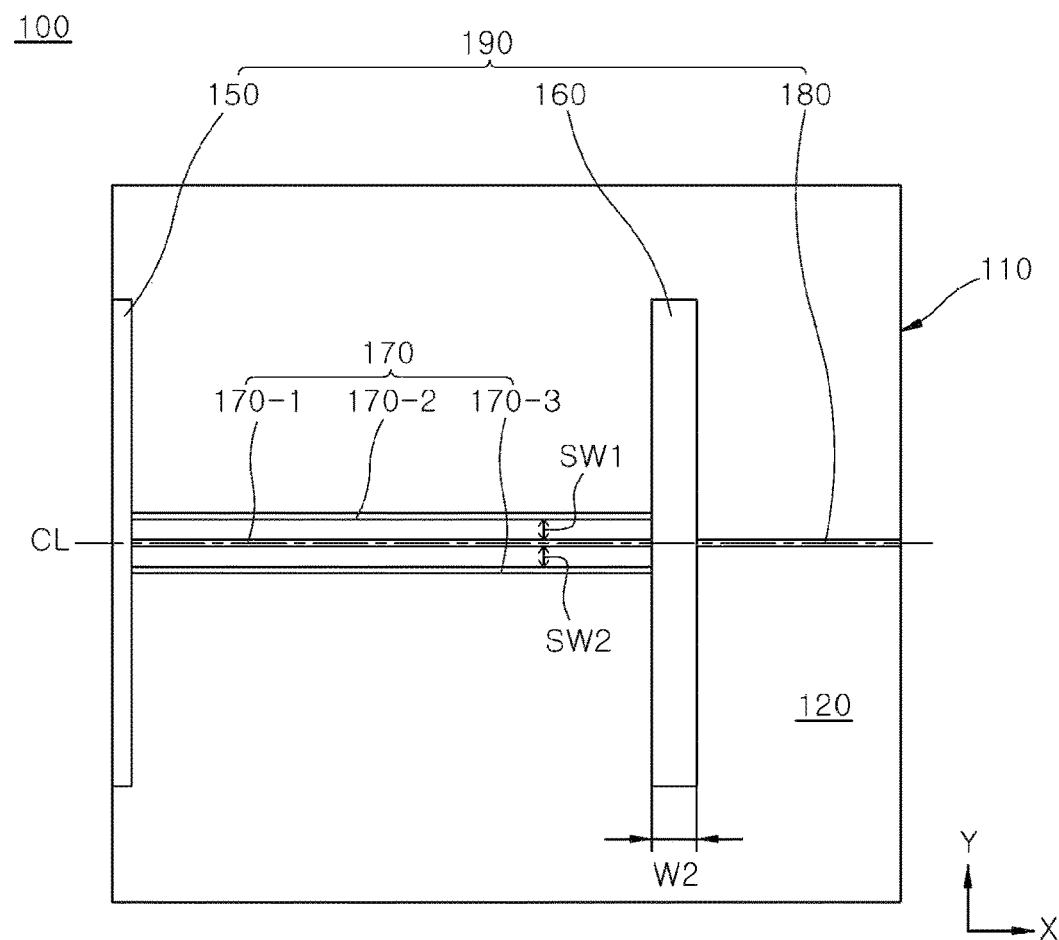
FIG. 2 is a plan view showing the band pass filter of FIG. 1.
Figure 3:
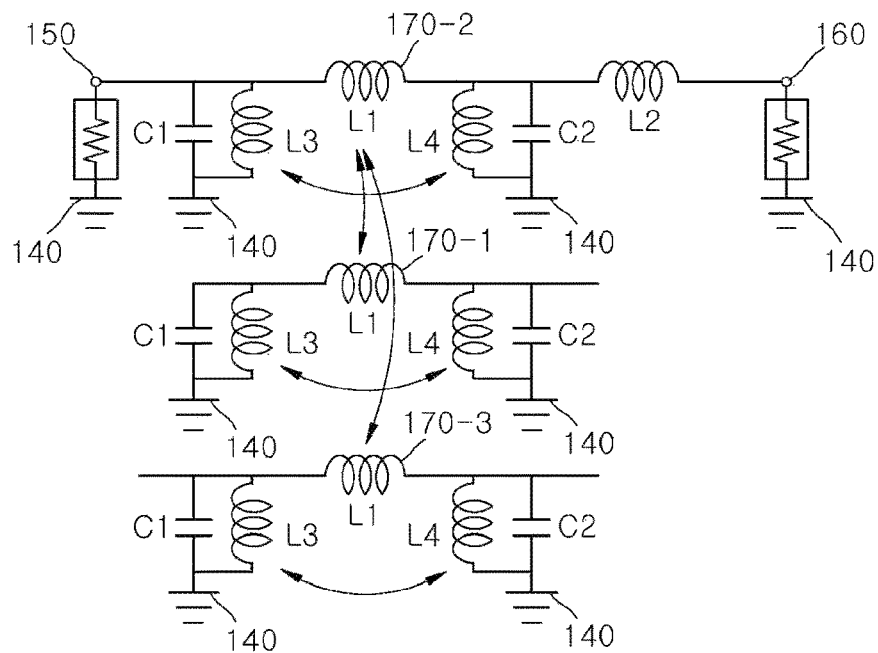
FIG. 3 is an equivalent circuit diagram showing the band pass filter of FIG. 1.

FIG. 1 is a perspective view showing a band pass filter including a microstrip transmission line according to an embodiment of the present invention. FIG. 2 is a plan view showing the band pass filter of FIG. 1. FIG. 3 is an equivalent circuit diagram showing the band pass filter of FIG. 1.

Referring to FIGS. 1 and 2, a band pass filter 100 according to an embodiment of the present invention may be configured to includes a substrate 110, a microstrip transmission line 190 formed on a side of the substrate 110 to transmit a radio frequency (RF) signal, and a ground plane 140 disposed on the other side of the substrate 110.

The substrate 110 is configured to include a top surface 120 and a rear surface 130 facing the top surface 120, includes a dielectric material, and is configured in a plate shape.

The ground plane 140 may be disposed in contact with the rear surface 130 facing the top surface 120 of the substrate 110. The ground plane 140 may be formed of a metal material including copper Cu or gold Au. For example, the ground plane 140 may be configured as a metal surface deposited on the rear surface 130 without progressing a patterning process. Accordingly, the rear surface 130 of the substrate 110 may have a shape covered by the ground plane 140 across the entire surface.

An input port 150, an output port 160, a plurality of signal transmission lines 170, and at least one microstrip transmission line 190 including a filtered signal output line 180 may be disposed on the top surface 120 of the substrate 110. The input port 150 receives transmission signals such as RF signals. Seeing from the top, the input port 150 may be disposed in the shape of a line extended in the Y-axis direction, which is the width direction of the substrate 110. For example, the input port 150 may be extended from the top surface 120 of the substrate 110 toward the side surface to be electrically connected to the ground plane 140 contacting with the rear surface 130 of the substrate 110. The input port 150 is formed to have a first width W1.

The output port 160 is disposed at a position spaced apart from the input port 150 as much as a predetermined distance. The output port 160 outputs a transmission signal filtered while the transmission signal received from the input port 150 passes through the microstrip transmission line 190. Seeing from the top, the output port 160 may be disposed to have a shape of a line extended in the Y-axis direction, which is the width direction of the substrate 110. For example, the output port 160 may be formed to be extended in the Y-axis direction, which is a direction the same as that of the input port 150. The output port 160 is formed to have a second width W2 and may be formed to have a width size the same as that of the input port 160 having the first width W1.

The plurality of signal transmission lines 170 may be disposed between the input port 150 and the output port 160. The plurality of signal transmission lines 170 filters transmission signals, such as RF signals, received from the input port 150 and transfers the filtered signals to the filtered signal output line 180 via the output port 160. The plurality of signal transmission lines 170 may be configured to include at least two signal transmission lines. For example, although the plurality of signal transmission lines 170 may be configured of three signal transmission lines of a first signal transmission line 170-1, a second signal transmission line 170-2, and a third signal transmission line 170-3, it is not limited thereto. For example, although a configuration of disposing three signal transmission lines is described in an embodiment of the present invention, n signal transmission lines may be disposed (n is a natural number equal to or greater than two).

The first signal transmission line 170-1, the second signal transmission line 170-2 and the third signal transmission line 170-3 may be formed to be extended in the X-axis direction, which is the length direction of the substrate 110 perpendicular to the input port 150 and the output port 160 disposed in the Y-axis direction of the substrate 110. For example, the first signal transmission line 170-1, the second signal transmission line 170-2 and the third signal transmission line 170-3 may be formed in a line shape of a straight line.

The first signal transmission line 170-1, the second signal transmission line 170-2 and the third signal transmission line 170-3 are shaped to have an end portion connected in contact with the input port 150 and the other end portion connected in contact with the output port 160, respectively.

Among the plurality of signal transmission lines 170, the first signal transmission line 170-1 may be disposed on the basis of the center line (CL) passing through the center portion of the length direction of the input port 150 and the output port 160, and the second signal transmission line 170-2 and the third signal transmission line 170-3 may be respectively disposed in parallel at positions spaced apart from the first signal transmission line 170-1 as much as a first space width SW1 and a second space width SW2 in the Y-axis direction, which is the width direction of the substrate 110. The first space width SW1 disposed between the first signal transmission line 170-1 and the second signal transmission line 170-2 and the second space width SW2 disposed between the first signal transmission line 170-1 and the third signal transmission line 170-3 may be configured to have the same width size.

Although the input port 150, the output port 160, the plurality of signal transmission lines 170 and the filtered signal output line 180 may be configured as a metal pattern formed through a patterning process using an etching process after forming a metal layer including a metal material such as copper Co or gold Cu on the entire surface of the top surface 120 of the substrate 110, it is not limited thereto. For example, although it is not shown in the figure, the plurality of signal transmission lines 170 may be configured to have a shape of an electrically connected metal wire bonded from the input port 150 to the output port 160 through a wire bonding process.

Referring to FIG. 3 which shows an equivalent circuit diagram of the band pass filter of FIG. 1, the band pass filter may be configured of a first capacitor C1 connected in series between the input port 150 and the ground plane 140, a second capacitor C2 connected in series between the output port 160 and the ground plane 140, a first inductance L1 by the first signal transmission line 170-1, the second signal transmission line 170-2 and the third signal transmission line 170-3 connected to the first capacitor C1 and the second capacitor C2 in series between the input port 150 and the output port 160, a third inductance L3 by the first signal transmission line 170-1, the second signal transmission line 170-2 and the third signal transmission line 170-3 connected to the first capacitor C1 in parallel between the input port 150 and the ground plane 140, a fourth inductance L4 by the first signal transmission line 170-1, the second signal transmission line 170-2 and the third signal transmission line 170-3 connected between the input port 150 and the ground plane 140, and a second inductance L2 by the filtered signal output line 180.

The band pass filter having the configuration as described above may implement the inductance components L1, L2, L3 and L4 required in a filter circuit using a plurality of signal transmission lines 170-1, 170-2 and 170-3 and may operate as a band pass filter by the influence of mutual inductance marked as an arrow in FIG. 3 between the third inductor L3, the fourth inductor L4 and the first inductor L1. A value of the first inductor L1 by the added second signal transmission line 170-2 or third signal transmission line 170-3 may be adjusted by the coupling strength of the mutual inductance, and frequency and bandwidth characteristics may be adjusted by the coupling strength of the mutual inductance. In addition, the frequency and bandwidth characteristics may be adjusted according to the number of signal transmission lines 170-1, 170-2 and 170-3 disposed between the input port 150 and the output port 160. This will be described below with reference to the drawings.

Figure 4:
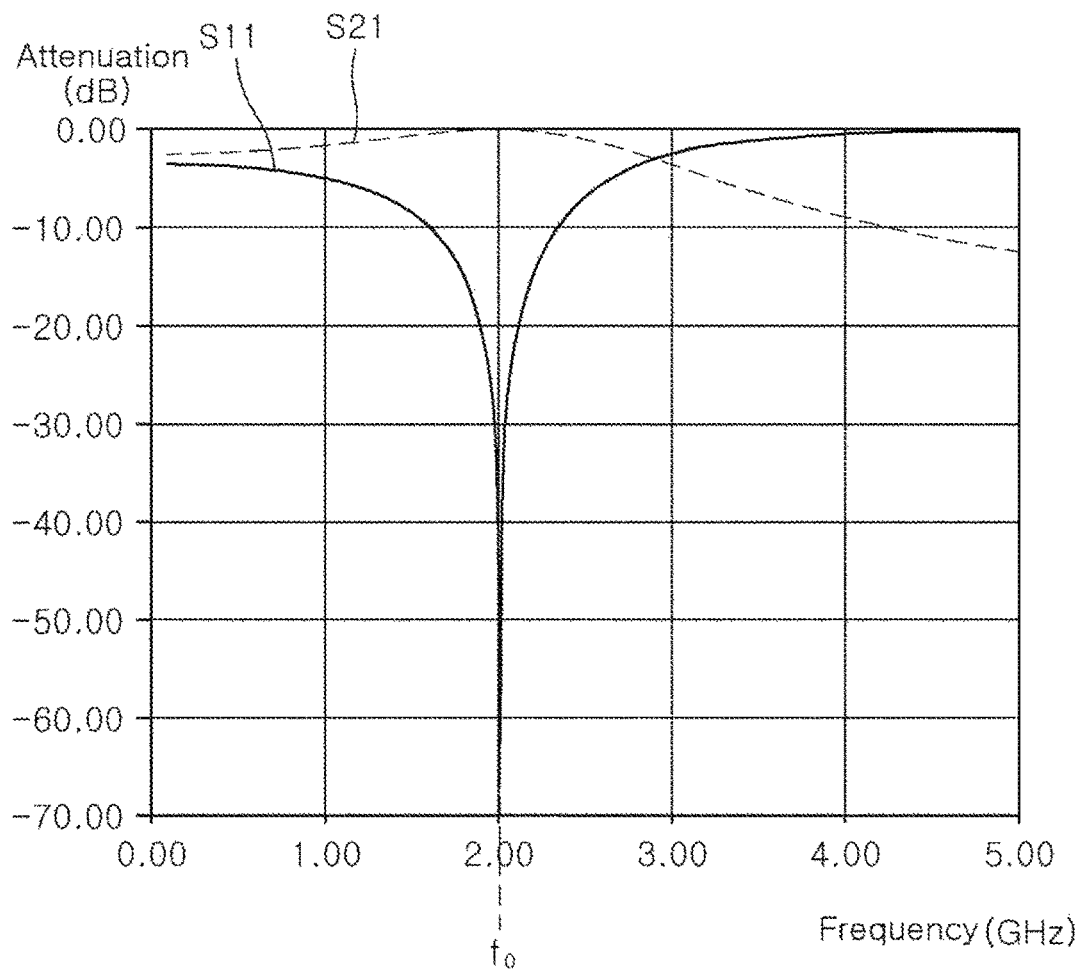
FIG. 4 is a graph showing changes in the frequency response characteristics according to the band pass filter of FIG. 1.

FIG. 4 is a graph showing changes in the frequency response characteristics according to the band pass filter of FIG. 1. For example, the band pass filter of FIG. 1 is designed assuming that the center frequency fo is 2 GHz. Referring to FIG. 4, the transmission characteristic S21 showing how much of the signal arrives at the output port 160 from the input port 150 has a value close to 0 dB in a pass band having a center frequency fo of 2 GHz. In addition, according to the graph showing the reflection characteristic S11 of the input port 150, it is understood that the input signal is transmitted to the output port 160 without being reflected as a low value of −60 dB lowest in the pass band of 2 GHz is shown. Accordingly, it is confirmed that it shows the characteristic of a band pass filter which filters low frequency signals and high frequency signals to pass only signals of a specific 2 GHz frequency region. As described above, according to the present invention, he band pass filter may be implemented by the plurality of signal transmission lines disposed between the input port 150 and the output port 160.

Figure 5:
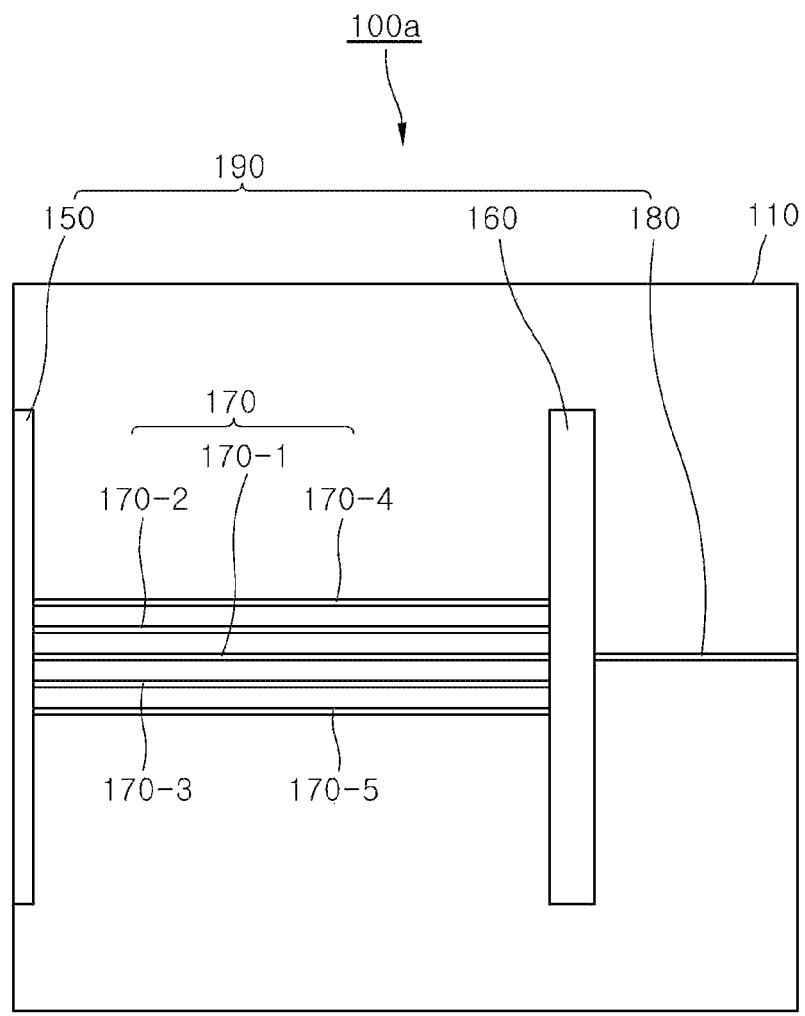
FIG. 5 is a plan view showing a band pass filter including a microstrip transmission line according to another embodiment of the present invention.

Meanwhile, the center frequency may be changed by changing the number of signal transmission lines 170. FIG. 5 is a plan view showing a band pass filter including a microstrip transmission line according to another embodiment of the present invention.

Referring to FIG. 5, the configuration of a band pass filter 100a according to another embodiment of the present invention is the same as that of the band pass filter 100 of FIG. 2, except the number of signal transmission lines 170. Accordingly, constitutional components the same as those of the band pass filter 100 of FIG. 2 will not be described or briefly described, and it will be described focusing on the difference. The band pass filter 100a may be configured to include at least a microstrip transmission line 190 including an input port 150, an output port 160, a plurality of signal transmission lines 170, and a filtered signal output line 180 disposed on a top surface 120 of a substrate 110. The signal transmission lines 170 may be configured of five signal transmission lines of a first signal transmission lines 170-1, a second signal transmission lines 170-2, a third signal transmission lines 170-3, a fourth signal transmission lines 170-4, and a fifth signal transmission lines 170-5.

Figure 6:
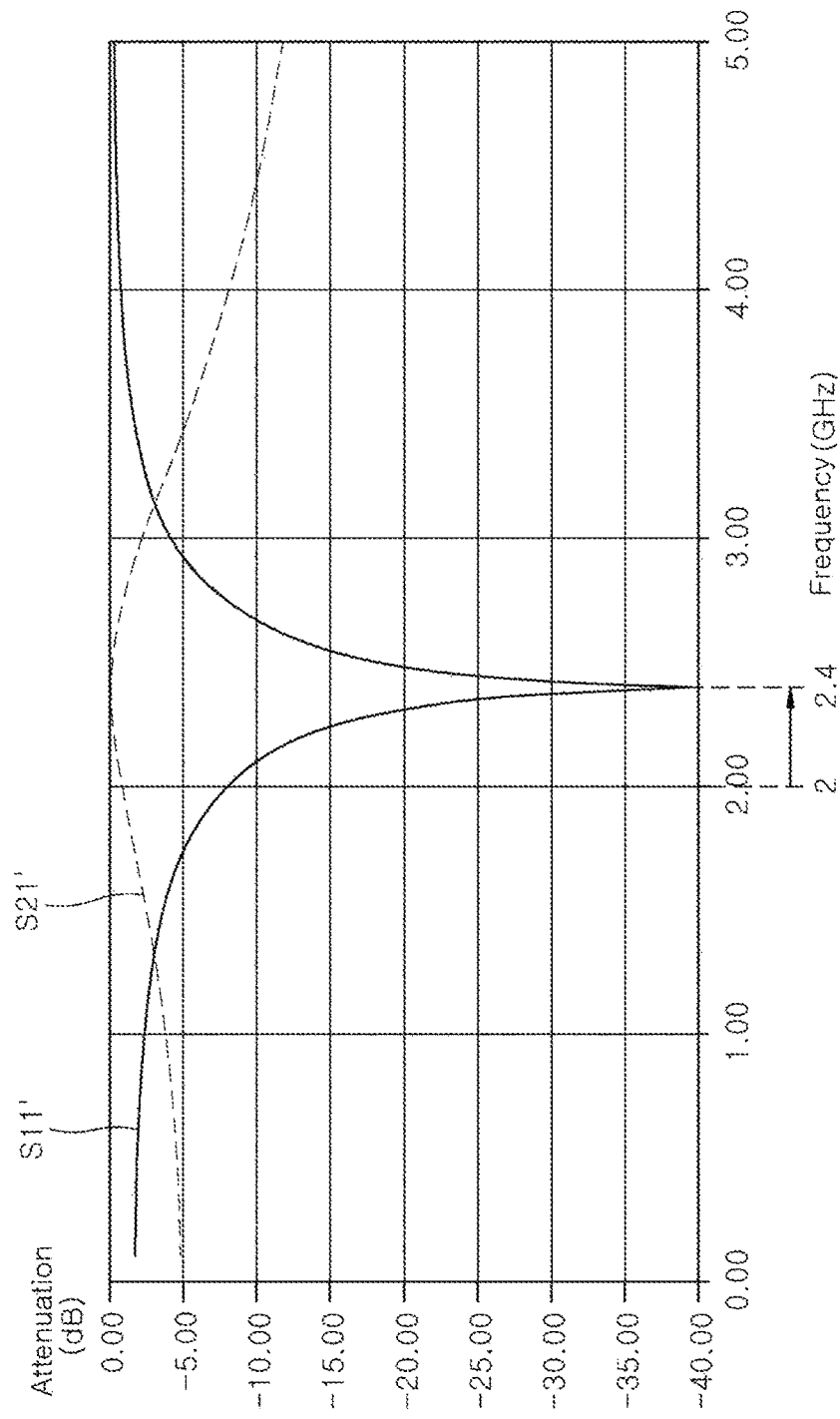
FIG. 6 is a graph showing changes in the frequency response characteristics according to the band pass filter of FIG. 5.

The band pass filter 100a shown in FIG. 5 has a configuration disposing two more signal transmission lines added to the band pass filter of FIG. 2. If the number of signal transmission lines disposed between the input port 150 and the output port 160 increases, the center frequency may be adjusted to a higher frequency as the mutual inductance increases between the first inductors L1 and the inductance value decreases as shown in the equivalent circuit diagram of FIG. 3. Referring to FIG. 6, which is a graph showing changes in the frequency response characteristic according to the band pass filter of FIG. 5, it is confirmed that the center frequency f1 has moved to 2.4 GHz.

In addition, if the number of signal transmission lines 170 is decreased or the space width is increased, the center frequency may be adjusted to a lower frequency as the mutual inductance decreases between the first inductors L1 and the inductance value decreases. When the center frequency of 2 GHz or lower is to be designed using the characteristic like this, the center frequency may be changed to a frequency desired by the designer by decreasing the number of signal transmission lines 170 disposed between the input port 150 and the output port 160 or increasing the space width between adjacent signal transmission lines 170.

Although the center frequency f1 moves to 2.4 GHz if the number of signal transmission lines 170 is adjusted, as the transmission characteristic S21' has a value close to 0 dB in a pass band of which the center frequency fo is 2 GHz and the reflection characteristic S11' of the input port 150 shows a low value of −40 dB that is lowest in the pass band, it is understood that the input signal is not reflected and transmitted to the output port 160. Accordingly, it is confirmed that only the center frequency f1 is changed, and the characteristic of the band pass filter still remains. In other words, a band pass filter which passes transmission signals in a frequency band desired by the designer can be easily implemented by adjusting the number of signal transmission lines 170.

FIG. 7 is a view showing a structure and an equivalent circuit of a low pass filter. Referring to FIG. 7, the low pass filter has a configuration disposing a signal transmission line 170a between an input port 150a and an output port 160a (see FIG. 7(a)). The low pass filter is configured of a first inductor L11 and a first capacitor C11 connected to the input port 150a in series, and a second inductor L22 and a second capacitor C22 connected to the output port 160a in series as shown in the equivalent circuit of FIG. 7(b), and shows the characteristic of a low pass filter of filtering transmission signals of high frequency received through the input port 150a to the ground plane 140a through the first and second capacitors C11 and C22 and transferring only transmission signals of low frequency to the output port 160a through the first inductor L11 and the second inductor L22.

In this case, the input port 150s and the output port 160a have a low impedance value, respectively, and are general designed on the basis of 50 ohm (Ω). In addition, to lower the impedance value to a low impedance value of 5 ohm (Ω), an impedance transformer for impedance matching should be disposed so that the input port 150a or the output port 160a designed on the basis of 50 ohm (Ω) may have an impedance value of 5 ohm (Ω). However, the lower the frequency is, an impedance transformer of a larger size is required. Accordingly, as the size of the impedance transformer for impedance matching increases to have an impedance value of 5 ohm (Ω), it is difficult to reduce the size of the impedance transformer.

Figure 8:
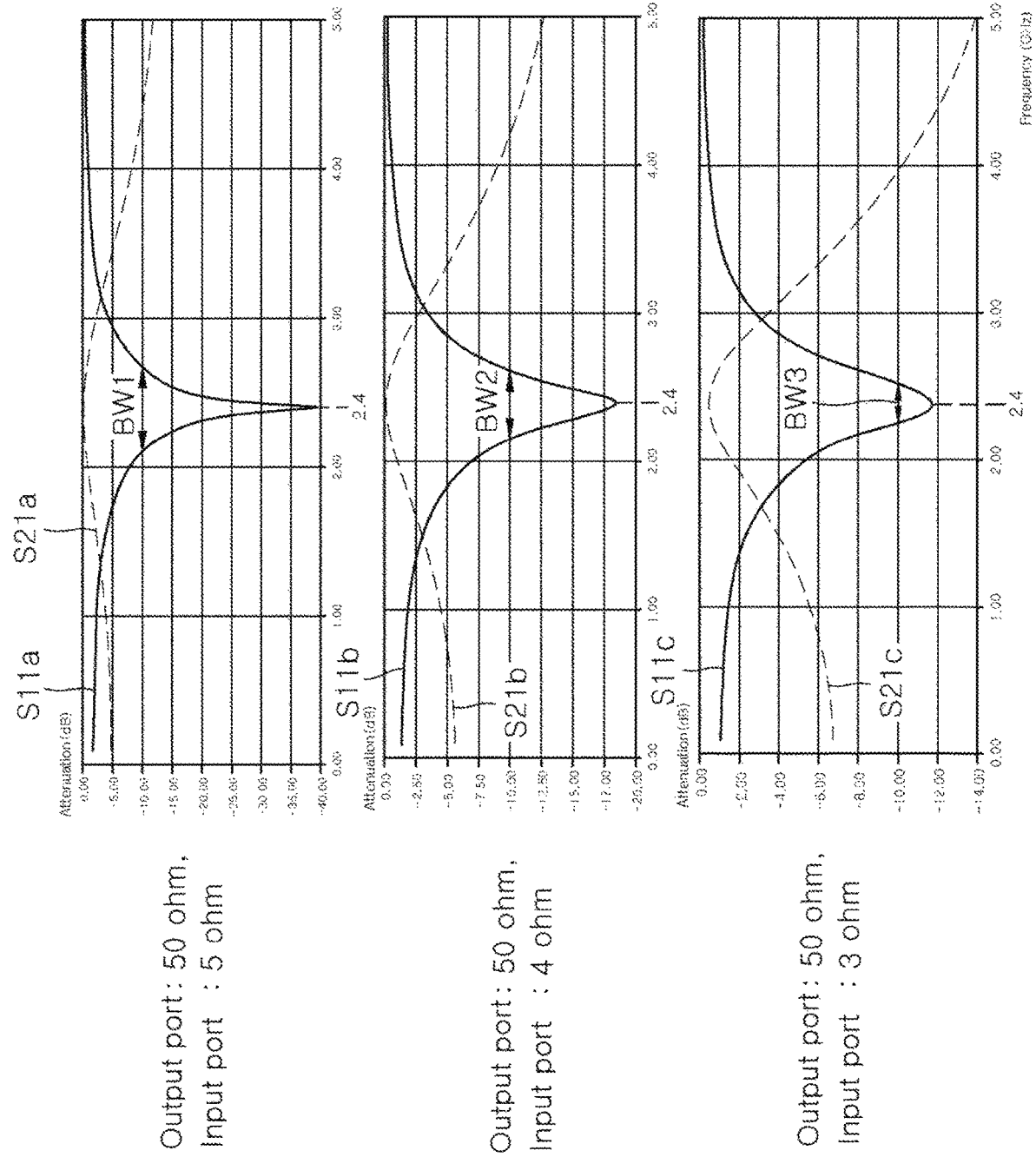
FIG. 8 is graphs showing changes in the frequency response characteristics according to changes in input impedance applied to the band pass filter of the present invention.

FIG. 8 is a view of graphs showing changes in the frequency response characteristics according to changes in input impedance applied to the band pass filter of the present invention. The frequency response characteristic of the band pass filter is measured by changing the impedance value on the input port 150a to 3 ohm (Ω), 4 ohm (Ω) and 5 ohm (Ω) while the impedance value on the output port 160a is fixed to 50 ohm (Ω). Here, it is designed assuming that the center frequency is 2.4 GHz. Referring to FIG. 8, the center frequency does not change from 2.4 GHz although the impedance value on the input port 150a is changed to 5 ohm (Ω) (a), 4 ohm (Ω) (b) and 3 ohm (Ω) (c).

In addition, as the transmission characteristics S21a, S21b and S21c show a value close to 0 dB in a pass band of which the center frequency is 2.4 GHz and the reflection characteristics S11a, S11b and S11c of the input port show the lowest value in the pass band in the graphs of frequency response characteristics measured while changing the impedance value on the input port 150a to 3 ohm (Ω), 4 ohm (Ω) and 5 ohm (Ω), it is confirmed that the input signal is not reflected. Accordingly, it is confirmed that although the impedance value on the input port is changed, the characteristic of the band pass filter still remains. In other words, when a band pass filter configured by disposing a plurality of signal transmission lines 170 according to an embodiment of the present invention is applied even in a situation in which the input port has an impedance value other than the basic impedance value of 50 ohm (Ω), a center frequency characteristic desired by the designer can be provided although an impedance transformer for impedance matching is not disposed on the input port 150 or the output port 160.

In addition, it is confirmed that as the impedance value on the input port 150 changes, the pass bandwidth is changed to 'BW1', 'BW2' and 'BW3'. Accordingly, a bandwidth desired by the designer can be easily implemented by changing the impedance value on the input port 150. As the band pass filter according to the present invention may omit the impedance transformer, the size of the band pass filter can be reduced, and as a result, there is an advantage of miniaturizing an electronic device including the band pass filter.

Figure 9:
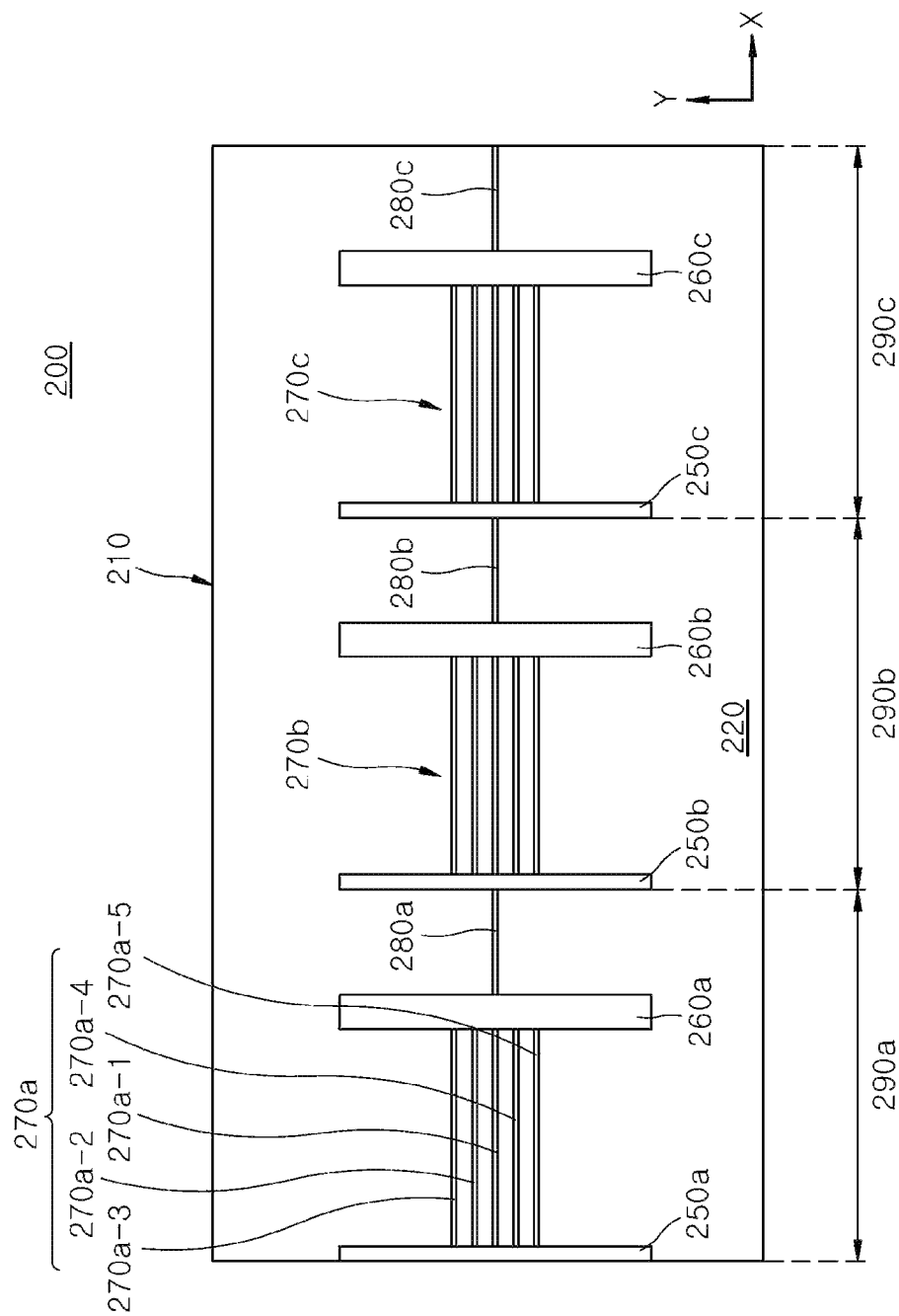
FIG. 9 is a plan view showing a band pass filter including a microstrip transmission line according to still another embodiment of the present invention.

FIG. 9 is a plan view showing a band pass filter including a microstrip transmission line according to still another embodiment of the present invention. In addition, FIG. 10 is a view illustrating the bandwidth of the band pass filter of FIG. 9.

The band pass filter 200 of FIG. 9 may be configured in a structure connecting a plurality of microstrip transmission lines 290a, 290b and 290c disposed on a top surface 220 of a substrate 210 in cascade. The microstrip transmission lines 290a, 290b and 290c may be configured to connect a first microstrip transmission line 290a, a second microstrip transmission line 290b and a third microstrip transmission line 290c in series. Each of the microstrip transmission lines 290a, 290b and 290c may be connected through filtered signal output lines 280a, 280b and 280c.

A first input port 250a and a first output port 260a of the first microstrip transmission line 290a are disposed to be spaced apart from each other as much as a predetermined distance, and a plurality of first signal transmission lines 270a may be disposed between the first input port 250a and the first output port 260a. The first signal transmission lines 270a are configured to includes n signal transmission lines (n is a natural number equal to or greater than two), and in the embodiment of the present invention, five signal transmission lines 270a-1, 270a-2, 270a-3, 270a-4 and 270a-5 are disposed. A first filtered signal output line 280a of the first microstrip transmission line 290a may be connected in contact with a second input port 250b of the second microstrip transmission line 290b. A second output port 260b may be disposed at a position spaced apart from the second input port 250b as much as a predetermined distance, and a plurality of second signal transmission lines 270b may be disposed between the second input port 250b and the second output port 260b. The second signal transmission lines 270b are configured to includes n signal transmission lines (n is a natural number equal to or greater than two), and for example, signal transmission lines as many as the first signal transmission lines 270a may be disposed.

The other end of a second filtered signal output line 280b connected to the second output port 260b at an end of may be connected in contact with a third input port 250c of the third microstrip transmission line 290c. A third output port 260c is disposed at a position spaced apart from the third input port 250c as much as a predetermined distance, and a plurality of third signal transmission lines 270c may be disposed between the third input port 250c and the third output port 260c. The third signal transmission lines 270c are configured to includes n signal transmission lines (n is a natural number equal to or greater than two), and for example, signal transmission lines as many as the first signal transmission lines 270a may be disposed. The transmission signal filtered by way of the first microstrip transmission line 290a, the second microstrip transmission line 290b and the third microstrip transmission line 290c may be transmitted to the outside through the third filtered signal output line 280c.

The transmission signal transmitted to the outside through the third filtered signal output line 280c may have a wideband characteristic. In other words, the band pass filter 200 configured in a structure connecting the first microstrip transmission line 290a, the second microstrip transmission line 290b and the third microstrip transmission line 290c in cascade may expand the bandwidth to a wideband. Specifically, the pass bandwidth of the first microstrip transmission line 290a, the pass bandwidth of the second microstrip transmission line 290b and the pass bandwidth of the third microstrip transmission line 290c respectively have a narrow pass bandwidth. If the microstrip transmission lines 290a, 290b and 290c respectively having a narrow pass bandwidth like this are connected in cascade, the bandwidth is increased NB1+NB2 by a constructive interference action generated by the overlap of a first narrow bandwidth NB1 and a second narrow bandwidth NB2, and thus a bandwidth WD of a wideband is generated. Accordingly, a band pass filter having a wideband characteristic may be designed by adjusting the number of microstrip transmission lines connected in cascade.

Meanwhile, the band pass filter according to the present invention may be applied to a coplanar plane waveguide (CPW) having a characteristic of positioning the ground plane and the signal transmission lines on the same surface or a coplanar waveguide with ground (CPWG) provided with a ground unit in which a ground plane additionally exists even on the rear surface, as well as the top surface of the substrate. Hereinafter, this will be described with reference to the drawings.

Figure 11:
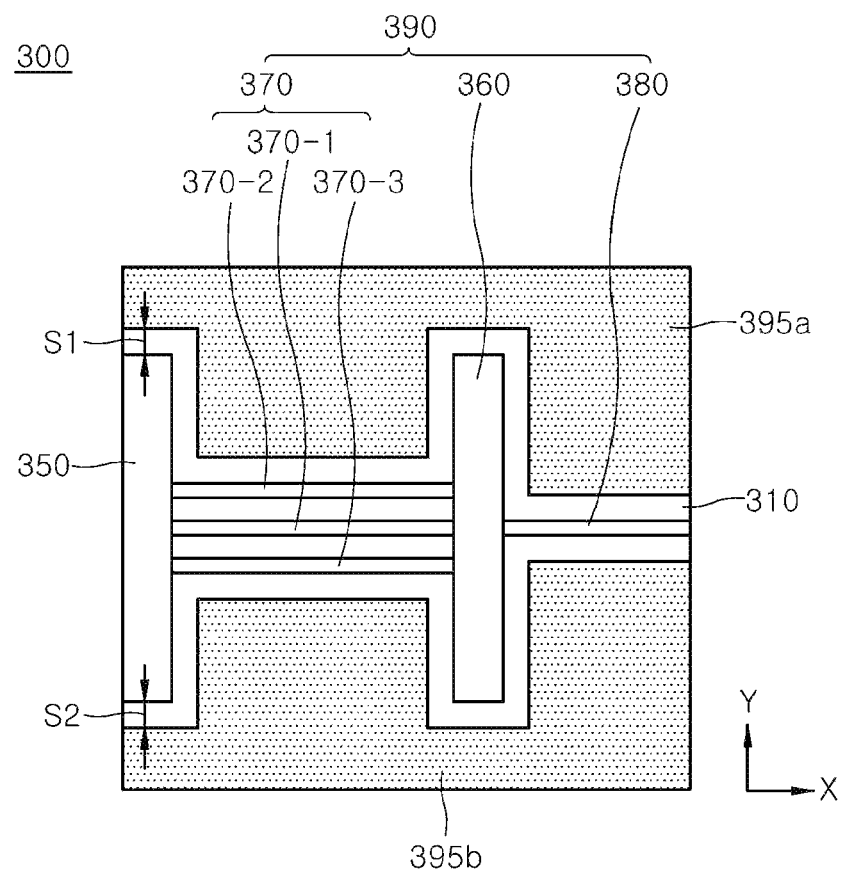
FIG. 11 is a view showing a modified embodiment of a band pass filter including a microstrip transmission line according to the present invention.

Referring to FIG. 11, in a band pass filter 300 applied to the coplanar plane waveguide (CPW), a microstrip transmission line 390 and a ground plane 395a and 395b are disposed on the top surface of a substrate 310. The microstrip transmission line 390 may be configured to include an input port 350 extended in the Y-axis direction of the substrate 310, an output port 360 disposed at a position spaced apart from the input port 350 as much as a predetermined distance and extended in the Y-axis direction of the substrate 310, and a plurality of signal transmission lines 370-1, 370-2 and 370-3 disposed between the input port 350 and the output port 360. The ground plane 395a and 395b may be configured of a first ground plane 395a disposed to be spaced apart from one side surface of the microstrip transmission line 390 as much as a first distance S1 and a second ground plane 395b disposed to be spaced apart from the other side surface of the microstrip transmission line 390 as much as a second distance S2.

In addition, when the band pass filter is applied to the coplanar waveguide with ground (CPWG) provided with a ground unit, although it is not shown in the figure, constitutional components may be configured to be the same as those of the band pass filter 300 of FIG. 11, other than the ground plane additionally disposed on the rear surface facing the top surface of the substrate 310.

The invention claimed is:

1. A band pass filter comprising:
   a substrate having a ground plane formed on a rear surface;
   an input port formed on a top surface of the substrate to receive a transmission signal;
   an output port formed on the top surface of the substrate to output a filtered transmission signal; and
   a plurality of signal transmission lines disposed in parallel to be spaced apart from each other as much as a predetermined distance, each of which an end is connected in contact with the input port, and another end is connected in contact with the output port,
   wherein the plurality of signal transmission lines are formed to include:
   a first signal transmission line passing through a center portion of a length direction of the input port and the output port; and
   a second signal transmission line and a third signal transmission line disposed in parallel at positions spaced apart from the first signal transmission line by a first space width and a second space width in a width direction of the substrate.

2. The band pass filter according to claim 1, wherein the input port or the output port is formed in a shape of a line extended in a width direction of the substrate, and the plurality of signal transmission lines are formed to be extended in a length direction of the substrate perpendicular to the input port or the output port.

3. The band pass filter according to claim 1, wherein the plurality of signal transmission lines are formed in a line shape of a straight line.

4. The band pass filter according to claim 1, wherein the plurality of signal transmission lines form a metal layer including a metal material on an entire surface of the top surface of the substrate and are configured as a metal pattern formed through a patterning process using an etching process.

5. The band pass filter according to claim 1, wherein the plurality of signal transmission lines are configured to have a shape of a metal wire bonded to be connected from the input port to the output port through a wire bonding process.

6. The band pass filter according to claim 1, wherein the first space width and the second space width have the same size.

7. A band pass filter comprising:
   a substrate having a ground plane formed on a rear surface;
   an input port formed on a top surface of the substrate to receive a transmission signal;
   an output port formed on the top surface of the substrate to output a filtered transmission signal; and
   a plurality of signal transmission lines disposed in parallel to be spaced apart from each other as much as a predetermined distance, each of which an end is connected in contact with the input port, and another end is connected in contact with the output port,
   wherein a pass bandwidth range is increased by fixing an impedance value on the output port and increasing an impedance value on the input port.

8. A band pass filter comprising:
   a substrate having a ground plane formed on a rear surface;
   an input port formed on a top surface of the substrate to receive a transmission signal;
   an output port formed on the top surface of the substrate to output a filtered transmission signal; and
   a plurality of signal transmission lines disposed in parallel to be spaced apart from each other as much as a predetermined distance, each of which an end is connected in contact with the input port, and another end is connected in contact with the output port,
   wherein a pass bandwidth range is decreased by fixing an impedance value on the output port and decreasing an impedance value on the input port.

* * * * *